(12) United States Patent
Taracila et al.

(10) Patent No.: US 12,405,329 B2
(45) Date of Patent: Sep. 2, 2025

(54) SPLIT TOROID CONFIGURATION FOR A CURRENT CABLE TRAP

(71) Applicant: GE Precision Healthcare LLC, Wauwatosa, WI (US)

(72) Inventors: Victor Taracila, Orange Village, OH (US); Jana Michelle Vincent, Aurora, OH (US); Meghan Blanks, Beavercreek, OH (US); Fraser John Laing Robb, Aurora, OH (US); Robert Steven Stormont, Hartland, WI (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 355 days.

(21) Appl. No.: 18/131,419

(22) Filed: Apr. 6, 2023

(65) Prior Publication Data

US 2024/0337713 A1 Oct. 10, 2024

(51) Int. Cl.
*G01R 33/36* (2006.01)
*G01R 33/34* (2006.01)

(52) U.S. Cl.
CPC ... *G01R 33/3685* (2013.01); *G01R 33/34007* (2013.01)

(58) Field of Classification Search
CPC .............. G01R 33/3685; G01R 33/34007
See application file for complete search history.

(56) References Cited

U.S. PATENT DOCUMENTS

| 6,593,744 | B2 | 7/2003 | Burl et al. | |
| 10,895,615 | B2* | 1/2021 | Wynn | G01R 33/3685 |
| 11,243,282 | B2* | 2/2022 | Zemskov | G01R 33/3685 |
| 2003/0209354 | A1* | 11/2003 | Seeber | H05K 9/0066 |
| | | | | 174/383 |
| 2021/0247475 | A1 | 8/2021 | Taracila et al. | |

OTHER PUBLICATIONS

Karasan et al., "Advances in Caterpillar Traps: A Highly Flexible, Distributed System of Toroid Cable Traps," Proc. Intl. Soc. Mag. Reson. Med. 29, 2021, 4 pgs.
Karasan et al., "The Very RF Hungry Caterpillar Trap (Highly Flexible, Distributed System of Toroid CableTraps)," Proc. Intl. Soc. Mag. Reson. Med. 28, 2020, 3 pgs.

* cited by examiner

*Primary Examiner* — Gregory H Curran
(74) *Attorney, Agent, or Firm* — Fletcher Yoder, P.C.

(57) ABSTRACT

A current cable trap includes a first body half having a first end and a second end and a second body half having a third end and a fourth end. The first body half and the second body half are configured to be snapped together about a cable to form a toroid body. The current cable trap includes a first wire and a second wire wrapped around the first body half and the second body half, respectively. The current cable trap includes a first printed circuit board and a second printed board disposed within a first receptacle and a second receptacle, respectively, when the first body half and the second body half are snapped together. The first printed circuit board and the second printed circuit board each provide electrical connection points with wire ends of both the first wire and the second wire.

19 Claims, 13 Drawing Sheets

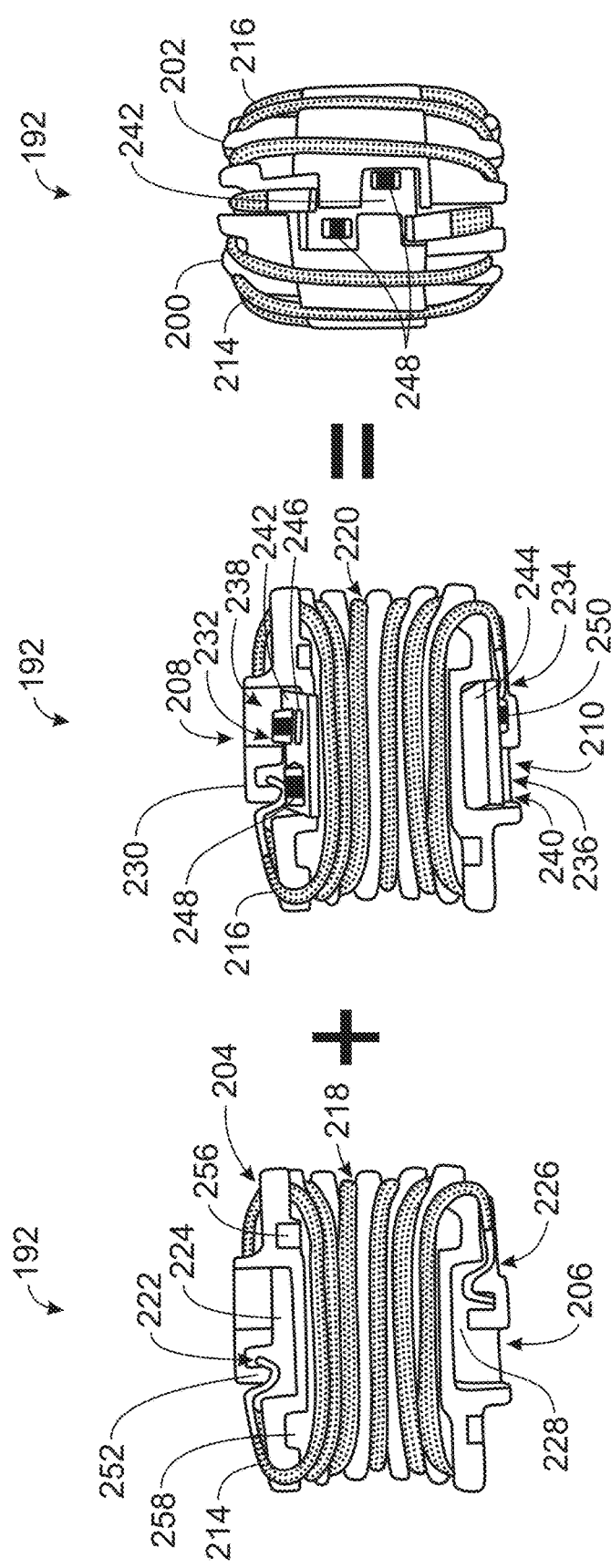
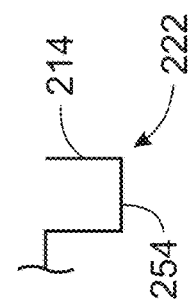
FIG. 5
FIG. 6

Cable Straight Across Phantom

| 10mm coronal slice | ROI 1 (Middle) | ROI 2 (Bottom) | ROI 3 (Top) |
|---|---|---|---|
| Standard Cable Difference | 4.6° | -1.7° | -8.5° |

266 ↗

| 10mm coronal slice | ROI 1 (Middle) | ROI 2 (Bottom) | ROI 3 (Top) |
|---|---|---|---|
| Toroid Cable Difference | 3.4° | 3.6° | 5.3° |

268 ↗

Cable in U-Shape Across Phantom (worse-case) →

| 10mm coronal slice | ROI 1 (Middle) | ROI 2 (Bottom) | ROI 3 (Top) |
|---|---|---|---|
| Toroid Cable Difference | 1.6° | 1.9° | 1.6° |

SPLIT TOROID CONFIGURATION FOR A CURRENT CABLE TRAP

BACKGROUND

The subject matter disclosed herein relates to medical imaging and, more particularly, to a split toroid configuration for a cable trap.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During magnetic resonance imaging (MRI), when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Typically, one or more baluns or cable traps are disposed along a cable that connects a radio frequency (RF) coil (e.g., body coil) to an MRI system. The cable traps reduce currents along the cable for patient safety. Typically, these cable traps are prone to detuning and typically need to be placed relatively far apart along the cable to avoid detuning. Further, these cable traps (which typically having a single body configuration threaded onto the cable) present a serviceability challenge in that if one of the cable traps breaks then an interface or connector of the broken cable trap, the broken cable trap, and all of the cable traps leading up to the broken cable trap need to be replaced.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a current cable trap is provided. The current cable trap includes a first body half having a first end and a second end. The current cable trap also includes a second body half having a third end and a fourth end. The first body half and the second body half are configured to be snapped together about a cable to form a toroid body disposed about the cable. The current cable trap further includes a first wire wrapped around the first body half from the first end to the second end. The current cable trap even further includes a second wire wrapped around the second body half from the third end to the fourth end. The current cable trap still even further includes a first printed circuit board disposed within a first receptacle formed between the first and third ends when the first body half and the second body half are snapped together. The current cable trap yet further includes a second printed circuit board disposed within a second receptacle formed between the second and fourth ends when the first body half and the second body half are snapped together. The first printed circuit board and the second printed circuit board each provide electrical connection points with wire ends of both the first wire and the second wire.

In another embodiment, a cable for a radio frequency receiving coil assembly configured for use with a magnetic resonance imaging system is provided. The cable includes a plurality of current cable traps disposed about the cable. Each current cable trap of the plurality of current cable traps is configured when the cable is generating a current to generate a self-contained magnetic field that does not cause detuning or interference with adjacent current cable traps disposed along the cable. Each current cable trap of the plurality of current cable traps is configured to be removed from the cable without needing to remove other current cable traps of the plurality of current cable traps disposed along the cable.

In a further embodiment, a method for manufacturing a current cable trap is provided. The method includes forming a first body half having a first end and a second end. The method also includes forming a second body half having a third end and a fourth end. The first body half and the second body half are configured to be snapped together about a cable to form a toroid body disposed about the cable. The method further includes wrapping a first wire around the first body half from the first end to the second end. The method even further includes wrapping a second wire around the second body half from the third end to the fourth end. The method still even further includes disposing a first printed circuit board within a first portion of a first receptacle located in the first end or the third end, wherein the first end and the third end form the first receptacle when the first body half and the second body half are snapped together. The method yet further includes disposing a second printed circuit board within a second portion of a second receptacle located in the second end or the fourth end, wherein the second end and the fourth end form the second receptacle when the first body half and the second body half are snapped together. The first printed circuit board and the second printed circuit board each provide electrical connection points with wire ends of both the first wire and the second wire.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein:

FIG. 5 depicts a schematic diagram of individual halves of a current cable trap and an assembled current cable trap, in accordance with aspects of the present disclosure;

FIG. 6 is a schematic diagram of a wire end of a wire utilized with a current cable trap, in accordance with aspects of the present disclosure;

FIG. 16 depicts tables comparing B1 distortion at different regions between a standard cable and a cable having current cable traps, in accordance with aspects of the present disclosure.

DETAILED DESCRIPTION

Figure 1:
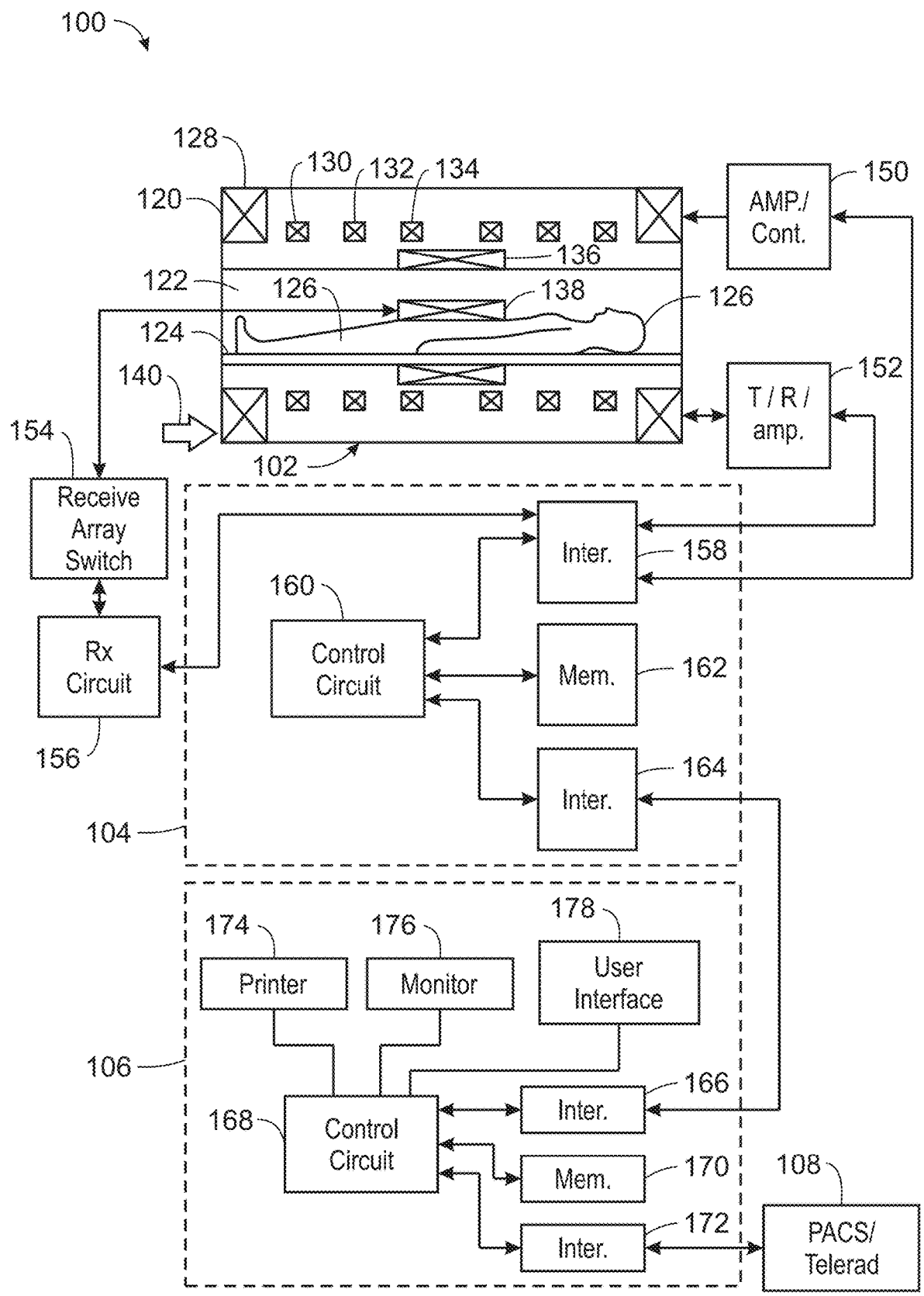
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

The present disclosure provides a split toroid configuration for a current cable trap or balun. The current cable trap includes a first body half or structure having a first end and a second end. The current cable trap also includes a second body half or structure having a third end and a fourth end. The first body half and the second body half are configured to be coupled (e.g., snapped) together about a cable to form a toroid body disposed about the cable. The current cable trap further includes a first wire wrapped around the first body half from the first end to the second end. The current cable trap even further includes a second wire wrapped around the second body half from the third end to the fourth end. The current cable trap still even further includes a first printed circuit board disposed within a first receptacle formed between the first and third ends when the first body half and the second body half are snapped together. The current cable trap yet further includes a second printed circuit board disposed within a second receptacle formed between the second and fourth ends when the first body half and the second body half are snapped together. The first printed circuit board and the second printed circuit board each provide electrical connection points (e.g., conductive contact pads) with wire ends of both the first wire and the second wire.

In certain embodiments, the first printed circuit board has a first pair of capacitors and the second printed circuit board has a second pair of capacitors, wherein each capacitor of both the first pair of capacitors and the second pair of capacitors has a same capacitor value. In certain embodiments, a first wire end of the first wire is configured to fit in a first groove adjacent the first end of the first body half and a second wire end of the first wire is configured to fit in a second groove adjacent the second end of the first body half, and wherein a third wire end of the second wire is configured to fit in a third groove adjacent the third end of the second body half and a fourth wire end of the second wire is configured to fit in a fourth groove adjacent the fourth end of the second body half. The first groove and the third groove form the first receptacle, and wherein the second groove and the fourth groove form the second receptacle. In certain embodiments, the first wire end and the second wire end each have a U-shape to respectively secure the first wire end and the second wire end within the first groove and the second groove, and wherein the third wire end and the fourth wire end each have the U-shape to respectively secure the third wire end and the fourth wire end within the third groove and the fourth groove. In certain embodiments, a respective bottom portion of the U-shape of each of the wire ends is configured to interface with a respective electrical connection point (e.g., conductive contact pad). In certain embodiments, the respective bottom portion of the U-shape of each of the wire ends may be linear or flat to increase contact area with the electrical connection point. In certain embodiments, the first body half includes a first set of internal and external grooves (e.g., internal and external relative to whether the surface where the groove is located is disposed internally on the toroid body or externally on the toroid body) disposed between the first end and the second end that the first wire is disposed within when wrapped around the first body half and the second body half includes a second set of internal and external grooves disposed between the third end and the fourth end that the second wire is disposed within when wrapped around the second body half.

A plurality of the current cable traps may be disposed about the cable. Each current cable trap is configured when the cable is generating a current to generate a self-contained magnetic field that does not cause detuning or interference with adjacent current cable traps disposed along the cable. In addition, each current cable trap is configured to be removed (e.g., when broken) from the cable without needing to remove other current cable traps disposed along the cable. In certain embodiments, the cable couples a radio frequency (RF) receiving coil assembly to a connector that is configured to couple the RF receiving coil assembly to an MRI system (e.g., having the current cable traps located external to the RF receiving coil assembly). In certain embodiments, the cable (e.g., having the current cable traps) is disposed within an enclosure of the radio frequency receiving coil assembly having an RF coil configured for use with an MRI system.

Although the current cable traps are discussed in the context of an MRI system, the current cable traps may be utilized within a dual imaging modality system. For example, the current cable traps may be utilized with a positron emission tomography (PET)/MRI system.

The disclosed current cable traps each have a self-contained, no-tune configuration that enables close placement of the current cable traps along the cable without causing detuning or interference among the current cable traps. The disclosed current cable traps do not need additional tuning due to having a same capacitor value and a same number of capacitors for each structure. The disclosed current cable traps improve patient safety by improving impedance across the cable and, thus, providing better suppression of common-mode currents that could lead to RF burns of the patient. The disclosed current cable traps also improve image quality due to less Bi distortion. The disclosed current cable traps provide a reduction in coil temperature (e.g., RF coil temperature) due to improved balun or current cable trap performance (i.e., allowing higher $B_1$+rms or root-mean-square value of the MRI effective component of the RF magnetic ($B_1$) field)). The disclosed current cable traps also improve serviceability since individual current cable traps due to the split configuration can be individually removed and replaced along the cable. The disclosed current cable traps enable a lighter cable due to the smaller size and uniformity of the current cable traps. The disclosed current cable traps allow for reduced manufacturing cost due to the easily-sourced and inexpensive material utilized in manufacturing the current cable traps.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on-or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, Bo, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
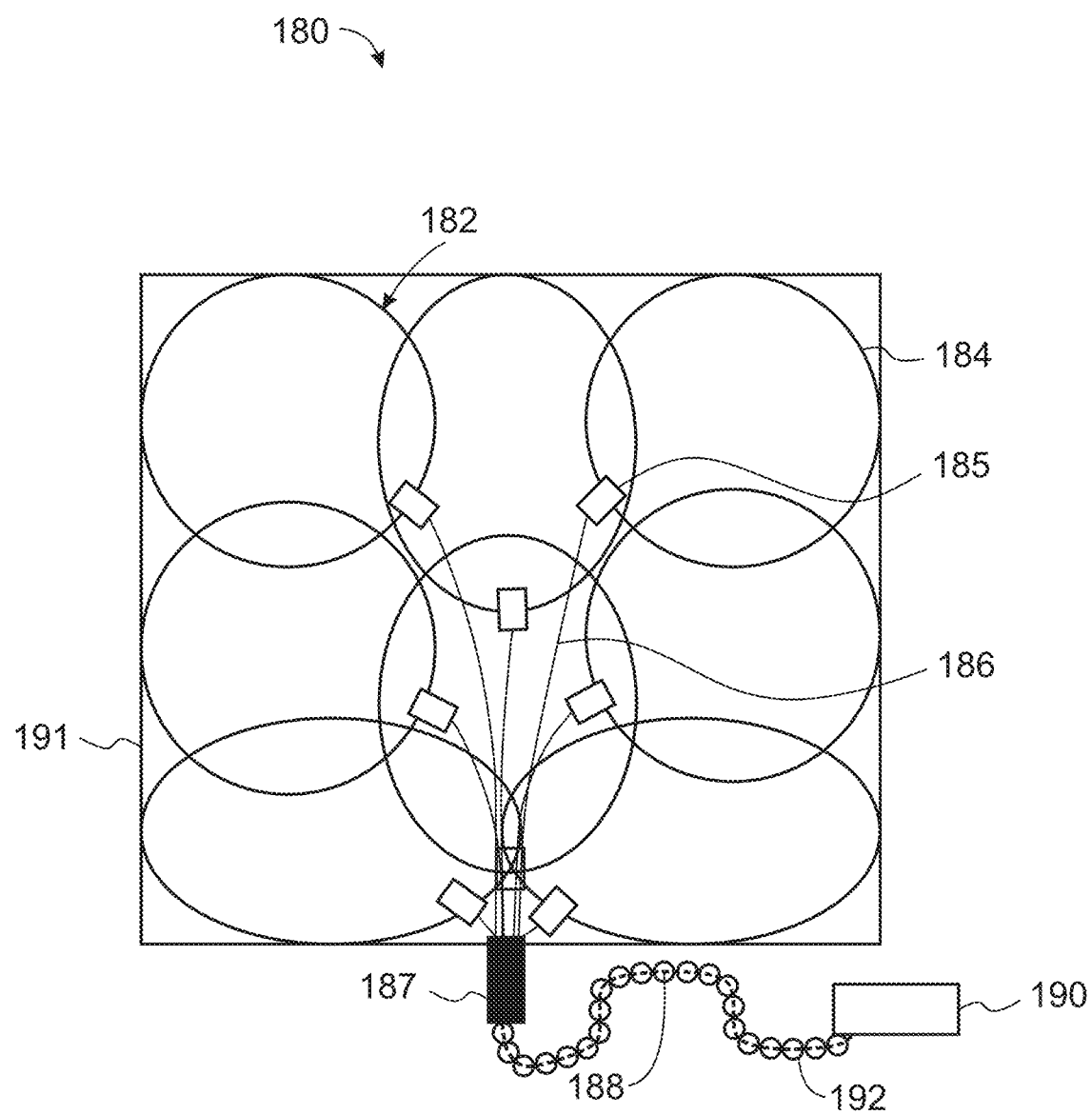
FIG. 2 is a schematic diagram of an RF receiving coil array and is topology, in accordance with aspects of the present disclosure.

FIG. 2 is a schematic diagram of an RF receiving coil array or assembly 180 and its topology. The shape and dimensions of the RF receiving coil array 180 may vary from that depicted in FIG. 2. The RF receiving coil array 180 may be utilized in an MRI system (e.g., MRI system 100 in FIG. 1). The RF receiving coil array 180 includes an RF coil 182 (e.g., flexible RF coil) having a plurality of loops 184 (e.g., elements or channels).

As depicted in FIG. 2, the plurality of loops 184 includes 8 loops (although the number of loops 184 may vary). Each loop 184 is coupled to an electronics unit 185 coupled to a coil-interfacing cable 186. The coil-interfacing cables 186 of each of the loops 184 is coupled to a balun 187 (e.g., integrated balun cable harness). Each electronics unit 185 may include various components (e.g., a decoupling circuit, an impedance inverter circuit, and a pre-amplifier). The balun 187 may act as an RF trap. The balun 187 is coupled (via a cable 188) to a P connector 190 (e.g., port connector) that enables the RF receiving coil 180 to be coupled to the interface of the MRI system that couples imaging components to processing components.

The loops 184 are disposed within an enclosure 191. In certain embodiments, the enclosure may be flexible. As depicted in FIG. 2, each loop 184 partially overlaps with at least one adjacent loop 184. In certain embodiments, one or more of the RF coils 182 may be designed utilizing AIR™ coil technology from General Electric Healthcare. This enables the RF coil 182 to be lightweight and flexible.

Figure 3:
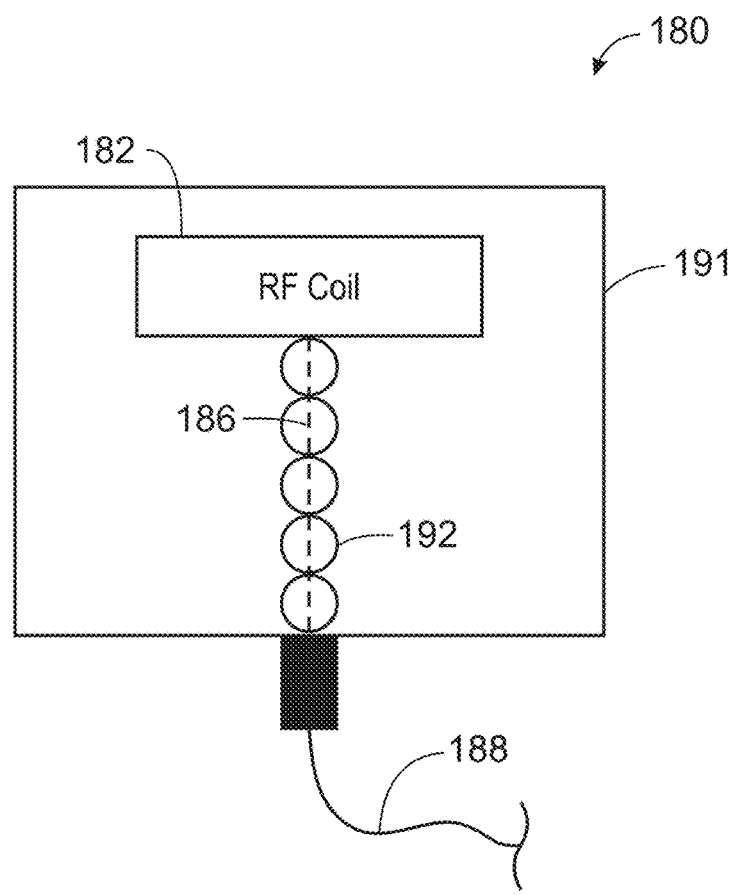
FIG. 3 is a schematic diagram of an RF receiving coil array having internal baluns or current cable traps, in accordance with aspects of the present disclosure.

As depicted, a plurality of baluns or current cable traps 192 (e.g., RF traps) having toroid body made of two halves are disposed about the cable 188 as described in greater detail below. In certain embodiments, one or more of these baluns or current cable traps 192 may be disposed internally (e.g., within the enclosure 191), for example, about one of the cables 186 as shown schematically in FIG. 3.

Figure 4:
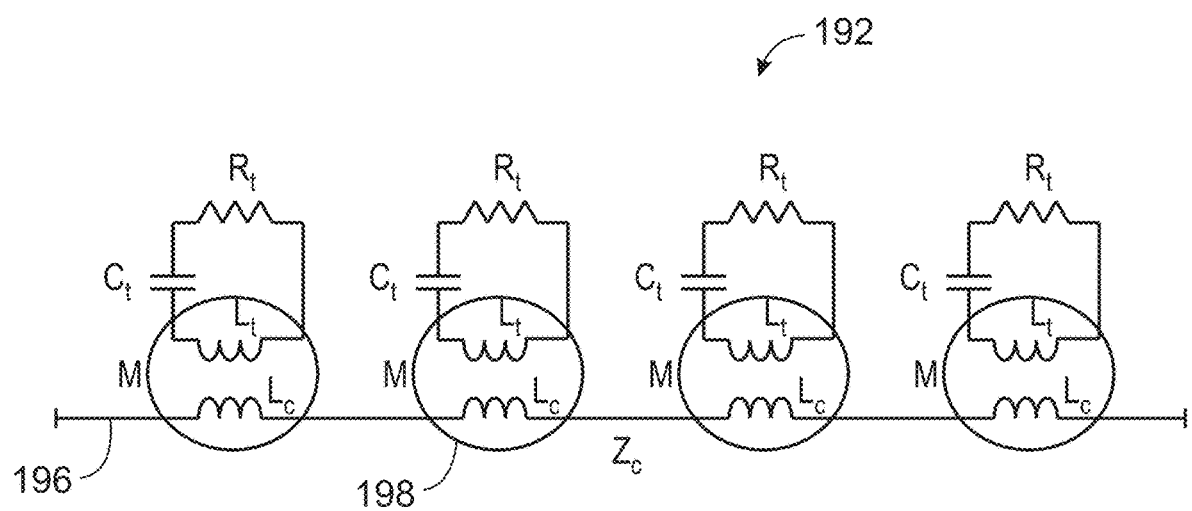
FIG. 4 is a schematic diagram of an electrical circuit formed between a cable and baluns or current cable traps, in accordance with aspects of the present disclosure.

FIG. 4 is a schematic diagram of an electrical circuit 194 formed between a cable 196 (e.g., cable 186 or cable 188 in FIG. 2) and a plurality of baluns or current cable traps 192. The baluns or current cable traps 192 each having a toroid body make of two halves as described in greater detail below. As depicted, four current cable traps 192 are disposed about the cable 196. The number of current cable traps 192 may vary. Mutual inductance (M) 198 is formed between each current cable trap 192 and the cable 196. The current cable traps 192 insert a large amount of impedance essentially blocking the path of the current at the proton frequency. In particular, the current cable traps 192 suppress common-mode currents that could lead to RF burns of the patient.

FIG. 5 depicts a schematic diagram of individual halves 200 and 202 of the current cable trap 192 and an assembled current cable trap 192. As depicted, the current cable trap 192 includes a split toroid configuration. In particular, the current cable trap 192 includes a first body half or structure 200 having a first end 204 and a second end 206. The current cable trap 192 also includes a second body half or structure 202 having a third end 208 and a fourth end 210. The first body half 200 and the second body half 202 are made of a non-magnetic material that is MRI compatible. For example, the first body half 200 and the second body half 202 may be made from 2-Phenyl-5-(trifluoromethyl)-1, 3-benzoxazole (PTFB), powdered nylon, a polycarbonate resin thermoplastic, or other material. The first body half 200 and the second body half 202 are configured to be coupled (e.g., snapped) together about a cable to form a toroid body 212 disposed about the cable.

The current cable trap 192 further includes a first wire 214 (e.g., magnet wire) wrapped around the first body half 200 from the first end 204 to the second end 206. The current cable trap 192 even further includes a second wire 216 (e.g., magnet wire) wrapped around the second body half 202 from the third end 208 to the fourth end 210. The first body half 200 includes a first set of internal and external grooves 218 (e.g., internal and external relative to whether the surface where the groove 218 is located is disposed internally on the toroid body 212 or externally on the toroid body 212) disposed between the first end 204 and the second end 206 that the first wire 214 is disposed within when wrapped around the first body half 202. The second body half 202 includes a second set of internal and external grooves 220 (e.g., internal and external relative to whether the surface where the groove 220 is located is disposed internally on the toroid body 212 or externally on the toroid body 212) disposed between the third end 208 and the fourth end 210 that the second wire 216 is disposed within when wrapped around the second body half 202.

A first wire end 222 of the first wire 214 is configured to fit in a first groove 224 adjacent the first end 204 of the first body half 200. A second wire end 226 of the first wire 214 is configured to fit in a second groove 228 adjacent the second end 206 of the first body half 202. A third wire end 230 of the second wire 216 is configured to fit in a third groove 232 adjacent the third end 208 of the second body half 202 and a fourth wire end 234 of the second wire 216 is configured to fit in a fourth groove 236 adjacent the fourth end 210 of the second body half 202. The first groove 224 and the third groove 232 form a first receptacle 238 when the first body half 200 and the second body half 202 are coupled (e.g., snapped) together. The second groove 228 and the fourth groove 236 form a second receptacle 240 when the first body half 200 and the second body half 202 are coupled (e.g., snapped) together.

The current cable trap 192 still even further includes a first printed circuit board 242 (e.g., first tuning printed circuit board) disposed within the first receptacle 238 formed between the first and third ends 204, 208 when the first body half 200 and the second body half 202 are snapped together. The first printed circuit board 242 may be disposed (e.g., inserted) in either the first groove 224 or the third groove 232 prior to coupling the first body half 200 and the second body half 202 together. The current cable trap 192 yet further includes a second printed circuit board 244 (e.g., second tuning printed circuit board) disposed within the second receptacle 240 formed betw246een the second and fourth ends 206, 210 when the first body half 200 and the second body half 202 are snapped together. The second printed circuit board 244 may be disposed (e.g., inserted) in either the second groove 228 or the fourth groove 236 prior to coupling the first body half 200 and the second body half 202 together. The first printed circuit board 242 and the second printed circuit board 244 serve as connection points (e.g., both physical and electrical) between the first body half 200 and the second body half 202 when coupled together to form the toroid body 212.

The first printed circuit board 242 and the second printed circuit board 244 each provide electrical connection points 246 (e.g., conductive contact pads) with wire ends of both the first wire 214 and the second wire 216. In particular, each printed circuit board 242, 244 includes two electrical connection points 246. The first printed circuit board 242 has a first pair of capacitors 248 and the second printed circuit board 244 has a second pair of capacitors 250, wherein each capacitor 248, 250 of both the first pair of capacitors 248 and the second pair of capacitors 250 has a same capacitor value. Since the capacitor values are the same no additional tuning is needed for the current cable trap 192.

As depicted, the first wire end 222 and the second wire end 226 each have a U-shape to respectively secure the first wire end 222 and the second wire end 226 within the first groove 224 and the second groove 228, respectively. The third wire end 230 and the fourth wire end 234 also each have the U-shape to respectively secure the third wire end 230 and the fourth wire end 234 within the third groove 232 and the fourth groove 236, respectively. In certain embodiments, a respective bottom portion of the U-shape of each of the wire ends is configured to interface with a respective electrical connection point 246 (e.g., conductive contact pad). In addition, each groove 224, 226, 232, 236 includes a wall portion 252 that a respective U-shaped end of a respective wire 214, 216 fits around. Each wall portion 252 is configured to serve as both an anchor for each respective wire 214, 216 and serves as a tension mount connector that maintains contact (via constant pressure) between a respective bottom portion of the U-shaped end of the respective wire 214, 216 with a respective electrical connection point 246. In certain embodiments, a respective bottom portion 254 of the U-shape of each of the wire ends may be linear or flat to increase contact area with the electrical connection point (e.g., as depicted in FIG. 6 using the first wire end 222 of the first wire 214. In assembling a respective wire 214, 216 on a respective body half 200, 202: first, one wire end of the respective wire 214, 216 is secured (e.g., anchored) about a respective wall portion 252 of a respective groove adjacent one end of a respective body half 200, 202; second, the respective wire 214, 216 is wrapped about the respective body half 200, 202 toward the opposite end within the respective internal and external grooves; and third, the other wire end of the respective wire 214, 216 is secured (e.g., anchored) about the respective wall portion 252 of the opposite groove adjacent the opposite end of the respective body half 200, 202.

Returning to FIG. 5, each body half 200, 202 includes a protrusion 256 disposed adjacent a respective end 204, 206, 208, 210. Each body half 200, 202 also includes a receptacle 258 disposed adjacent a respective end 204, 206, 208, 210. Each protrusion 256 on each body half 200, 202 is configured to be inserted within a corresponding receptacle 258 on the other body half 200, 202 when the first body half 200 and the second 202 are coupled (e.g., snapped) together about a cable.

Figure 7:
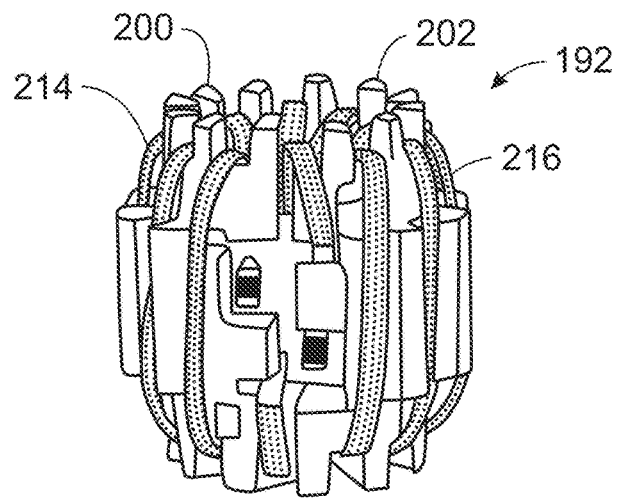
FIG. 7 depicts a schematic diagram an assembled current cable trap (e.g., having flattened wires), in accordance with aspects of the present disclosure.
Figure 8:
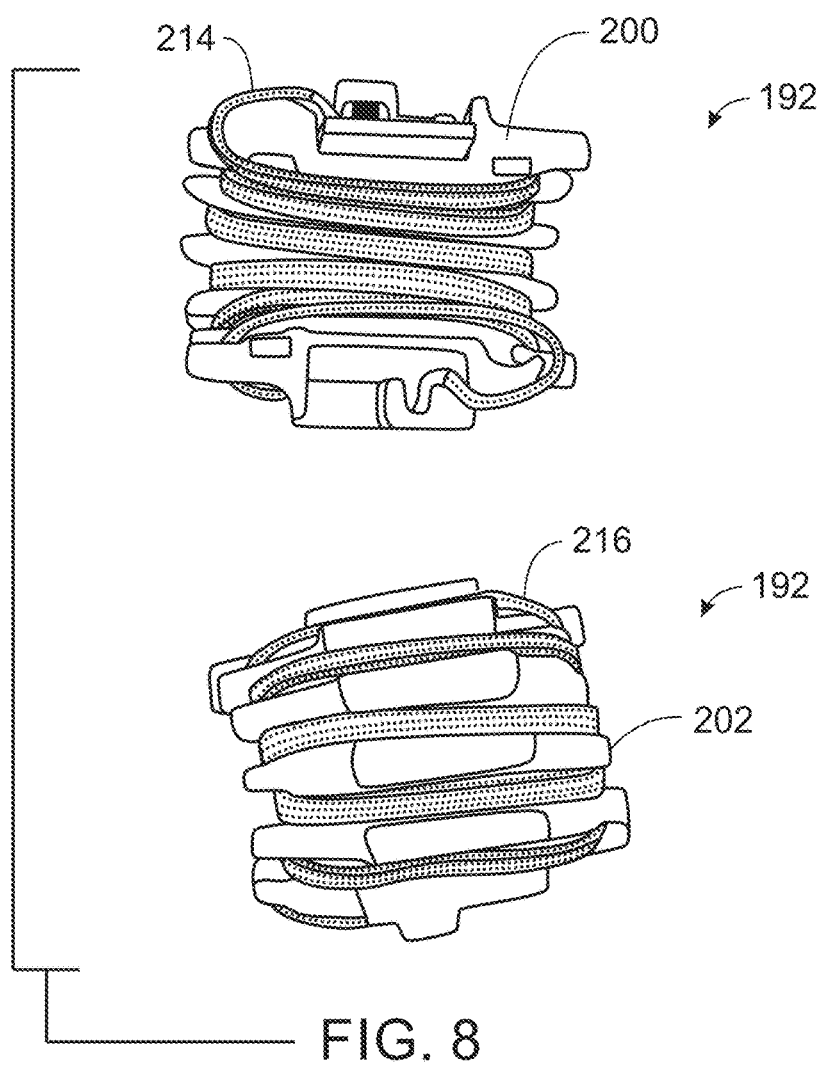
FIG. 8 depicts a schematic diagram of halves of the current cable trap in FIG. 7, in accordance with aspects of the present disclosure.

The type of wire utilized for the wires 214, 216 may vary. Each wire 214, 216 includes an insulation disposed about the wires 214, 216 between the respective ends of the wires 214, 216. As depicted in FIG. 5, the wires 214, 216 are stripped, tinned, flattened, and bent in a U-shape on each respective end. As depicted in FIGS. 7 and 8, the entirety of the wires 214, 216 are flattened that are utilized with the current cable trap 192. FIG. 7 depicts a schematic diagram of an assembled current cable trap 192 having flattened wires 214, 216. FIG. 8 depicts a schematic diagram of the body halves 200, 202 of the current cable trap 192 (i.e., with the 202, 202 not coupled together). The internal surface (i.e., that will face cable and other the body half 202) of the first body half 200 is shown in FIG. 8. The external surface (i.e., that will face away from both the cable and the other body half 200) of the second body half 202 is shown in FIG. 8. The structure of the current cable trap 192 in FIGS. 7 and 8 is as described in FIG. 5.

Returning to FIG. 5, the current cable trap 192 is configured to be removed (e.g., unsnapped) from the cable without needing to remove other current cable traps disposed along the cable (e.g., in case of a broken current cable trap 192). In addition, each current cable trap 192 may be disposed in a variety of positions along the cable (e.g., in a floating arrangement) without hindering the performance of adjacent current cable traps 192. A size of the current cable trap 192 depends on a diameter of a cable or cable bundle that the current cable trap 192 is to be utilized with, although the current cable trap 192 is smaller than a standard cable balun.

Figure 9:
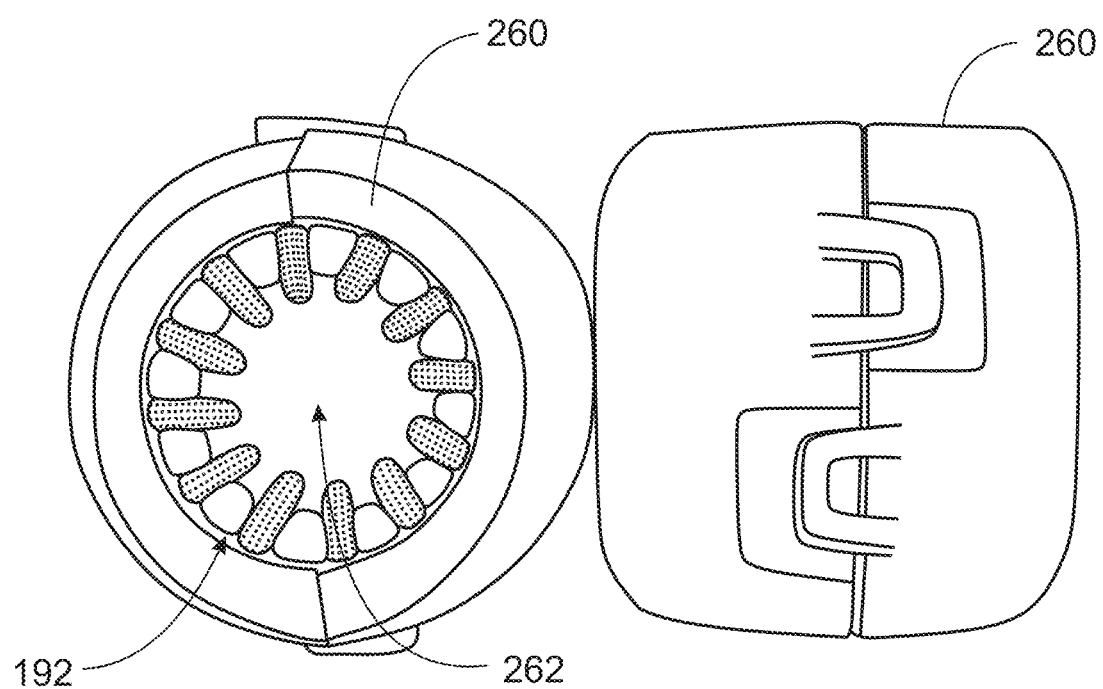
FIG. 9 depicts a schematic diagram of an end view and a side view of current cable traps having covers, in accordance with aspects of the present disclosure.

In certain embodiments, once the current cable traps 192 are disposed on a cable, an overmould may be disposed over the current cable traps 192. Alternatively, in certain embodiments, a cover may be utilized for each current cable trap 192. FIG. 9 depicts a schematic diagram of an end view and a side view of current cable traps 192 having covers 260. In particular, the covers 260 are snap-on covers made of two halves that can be disposed or secured about the current cable traps 192. The covers 260 are made of a non-magnetic material that is MRI compatible. As depicted, the toroid body 212 defines a bore 262 that the cable may be disposed through.

Figure 10:
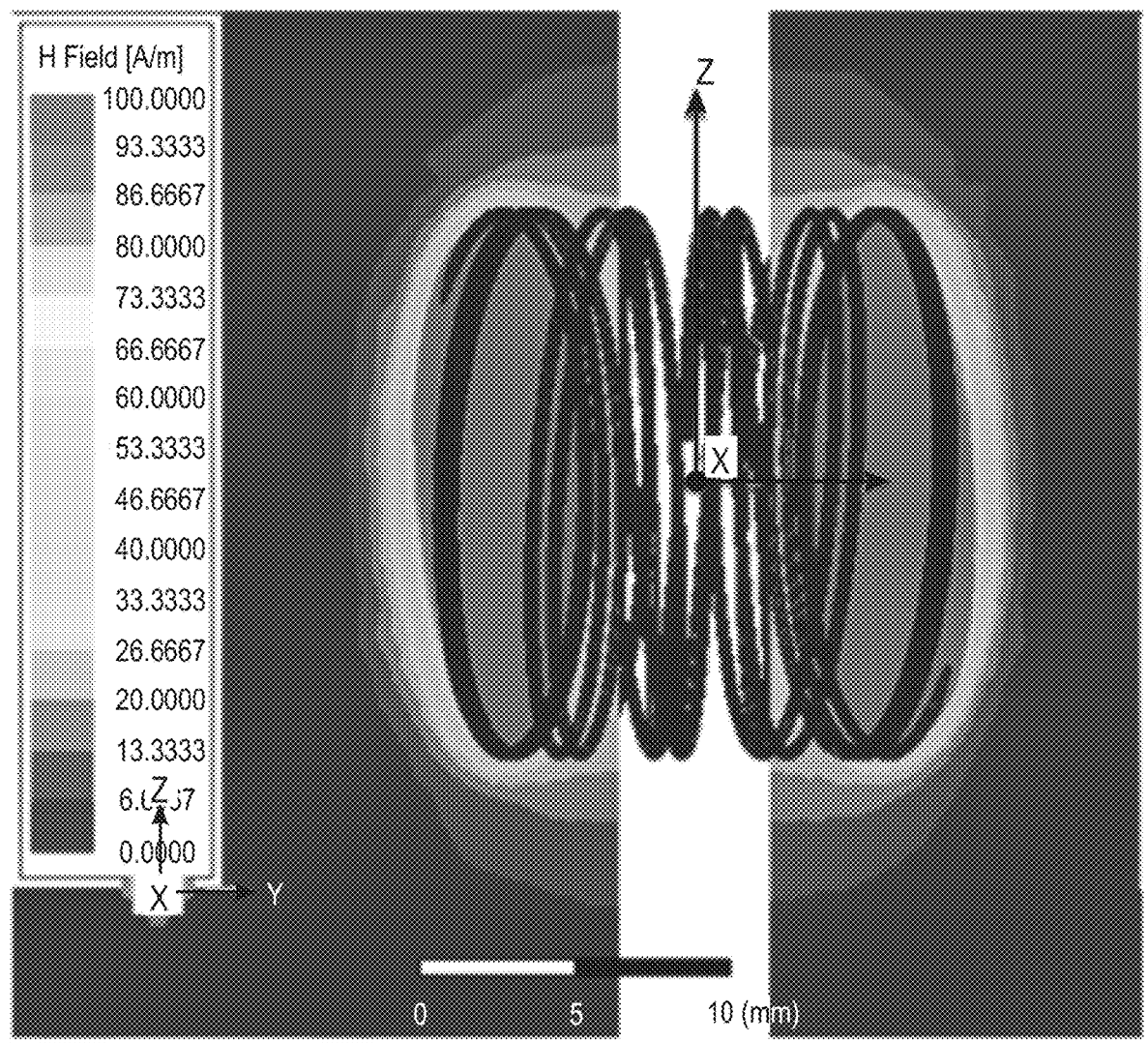
FIG. 10 depicts a magnetic field distribution of a current cable trap, in accordance with aspects of the present disclosure.

Utilization of the toroid body 212 for the current cable trap 192 enables the toroidal moment to create a contained magnetic field. This makes the current cable traps 192 more electrically stable. FIG. 10 depicts a magnetic field distribution 264 of the current cable trap 192. The magnetic field (H) is contained within the toroid structure of the current cable trap 192. This makes the current cable trap 192 less susceptible to detuning due to balun placement/shifting along the cable and outside interference. No detuning means no increase in heating. Since the current cable trap 192 is less susceptible to detuning there is significantly less chance of user-generated issues that may cause detuning (e.g., using current cable traps as handles or placing it near objects that may cause detuning). Due to this electrical stability, if one of the current cable traps 192 malfunctions, the distributed impedance will compensate and keep the cable and coil operating within acceptable surface temperatures (without having discontinue use of the cable).

Figure 11:
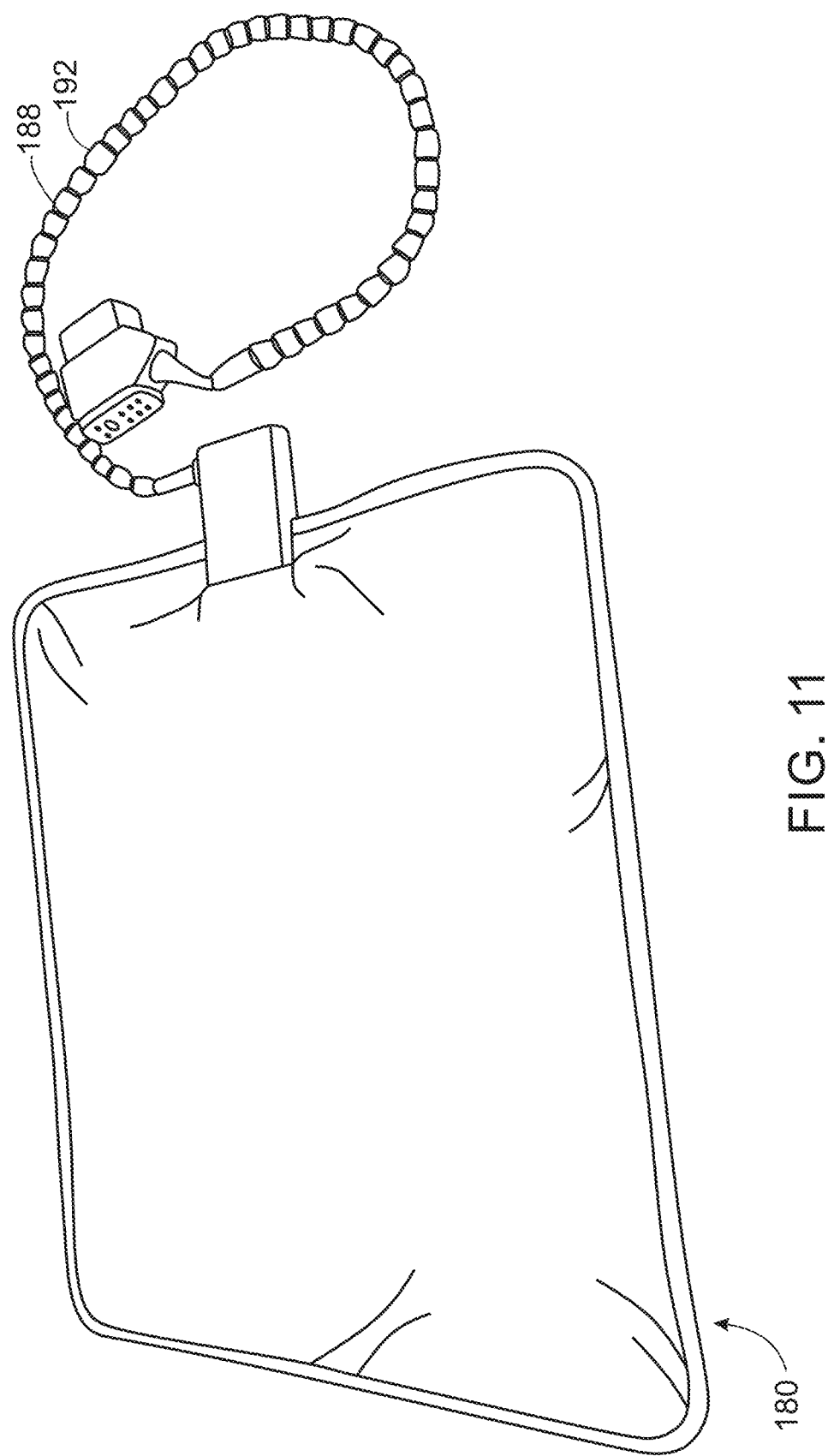
FIG. 11 depicts a schematic diagram an RF receiving coil assembly having current cable traps disposed about a cable, in accordance with aspects of the present disclosure.
Figure 12:
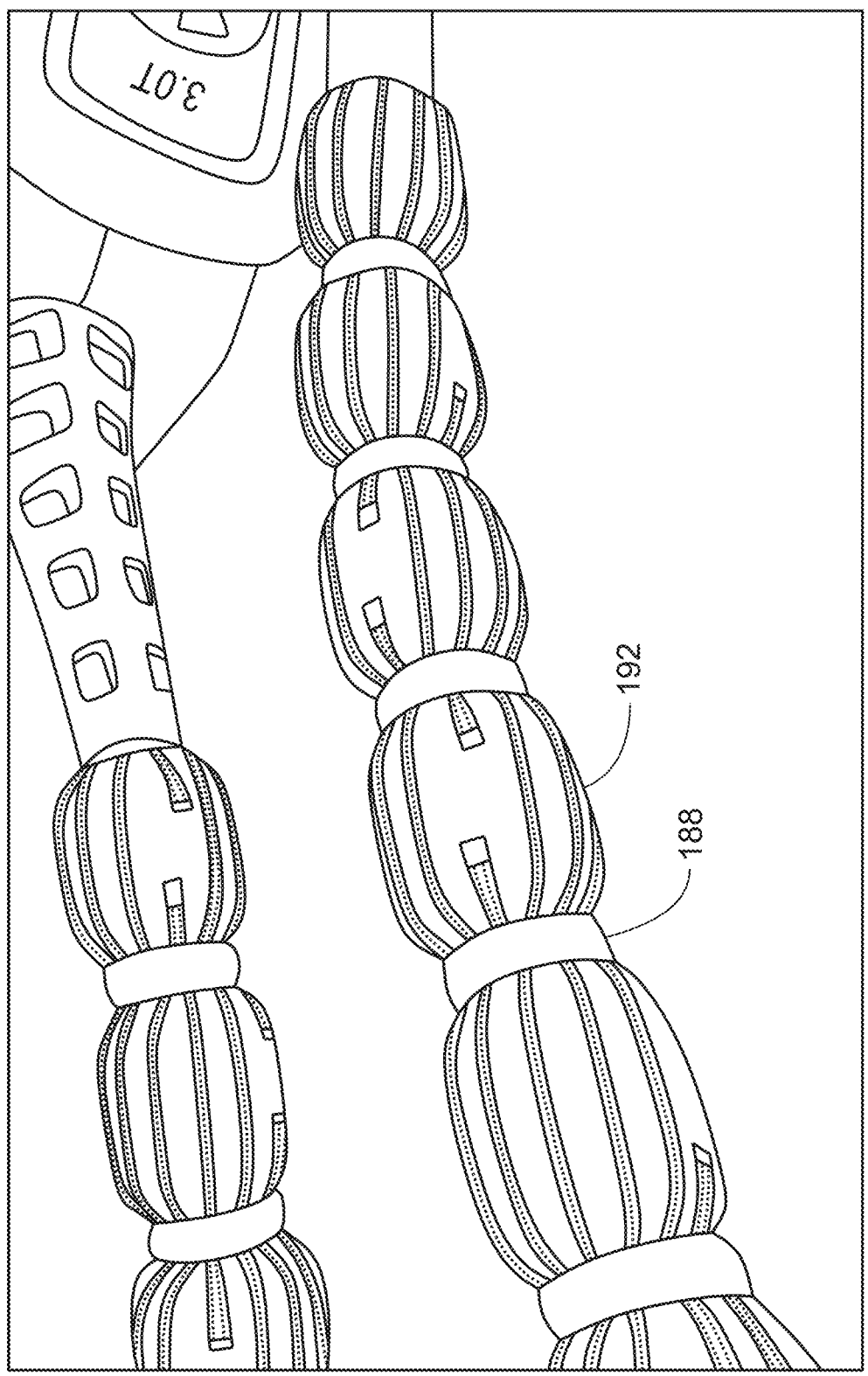
FIG. 12 depicts a schematic diagram of a portion of a cable of an RF receiving coil assembly having current cable traps disposed about a cable, in accordance with aspects of the present disclosure.
Figure 13:
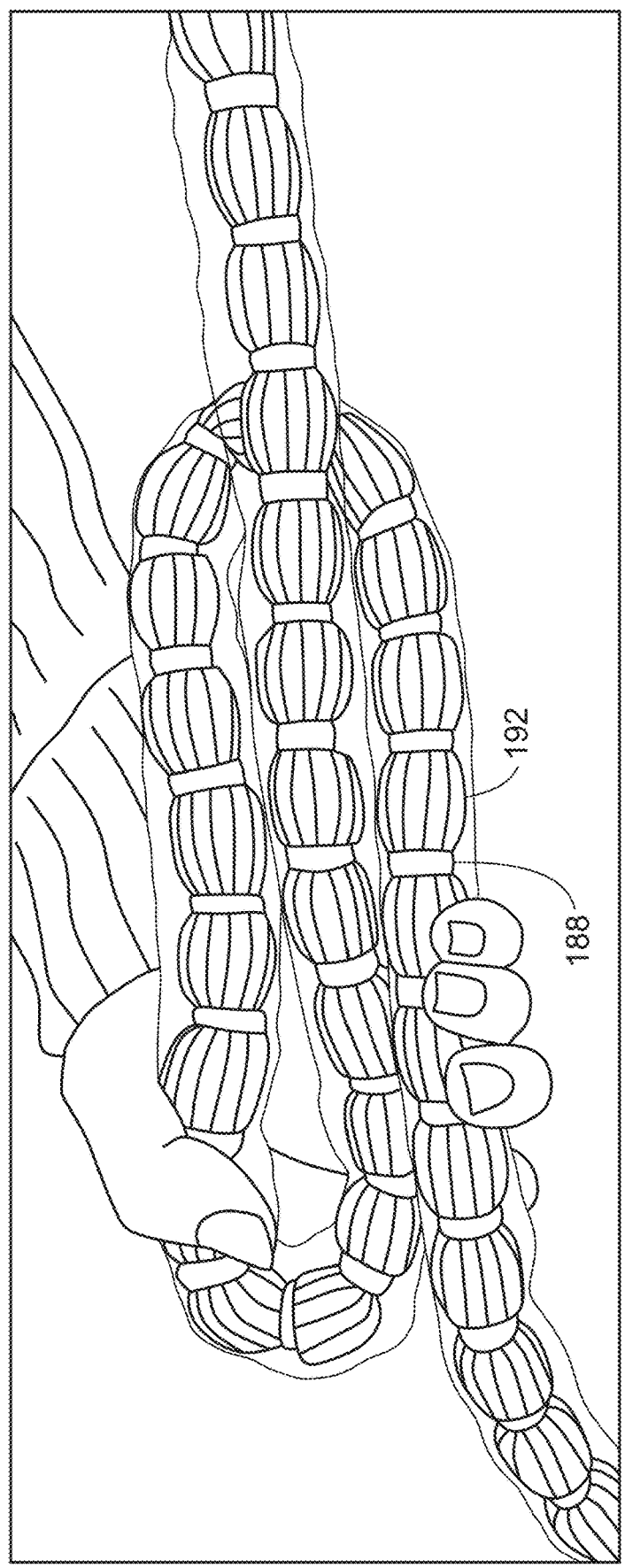
FIG. 13 depicts a schematic diagram of a cable of an RF receiving coil assembly having current cable traps (e.g., illustrating the flexibility of the cable), in accordance with aspects of the present disclosure.

As noted above, a plurality of the current cable traps 192 may be disposed about the cable. FIGS. 11-13 illustrates a plurality of the current cable traps 192 disposed about the cable 188 of the RF receiving coil array or assembly 180. As depicted in FIGS. 11-13, the current cable traps 192 can be tightly fit together on the cable 188. The number of current cable traps 192 disposed on the cable 188 may vary. As noted above, due to the no-tune configuration (i.e., no detuning or interference from close placement to other current cable traps 192) placement of the current cable traps 192 is not critical to function, although a higher density of the current cable traps 192 at the coil interface enhances performance. As depicted in FIG. 13, even at high densities (i.e., a high number of current cable traps 192 disposed on the cable 188), the cable 188 remains highly flexible (e.g., due to the smaller size of the current cable traps compared to a standard cable balun). Further, utilization of the current cable traps (as opposed to standard baluns) reduces an overall weight of the cable. For example, a standard cable may weigh approximately 2.04 pounds while a cable having 32 current cable traps 32 weighs approximately 1.54 pounds (e.g., approximately 30 percent lighter). The more flexible and lighter cable (utilizing the current cable traps)

Figure 14:
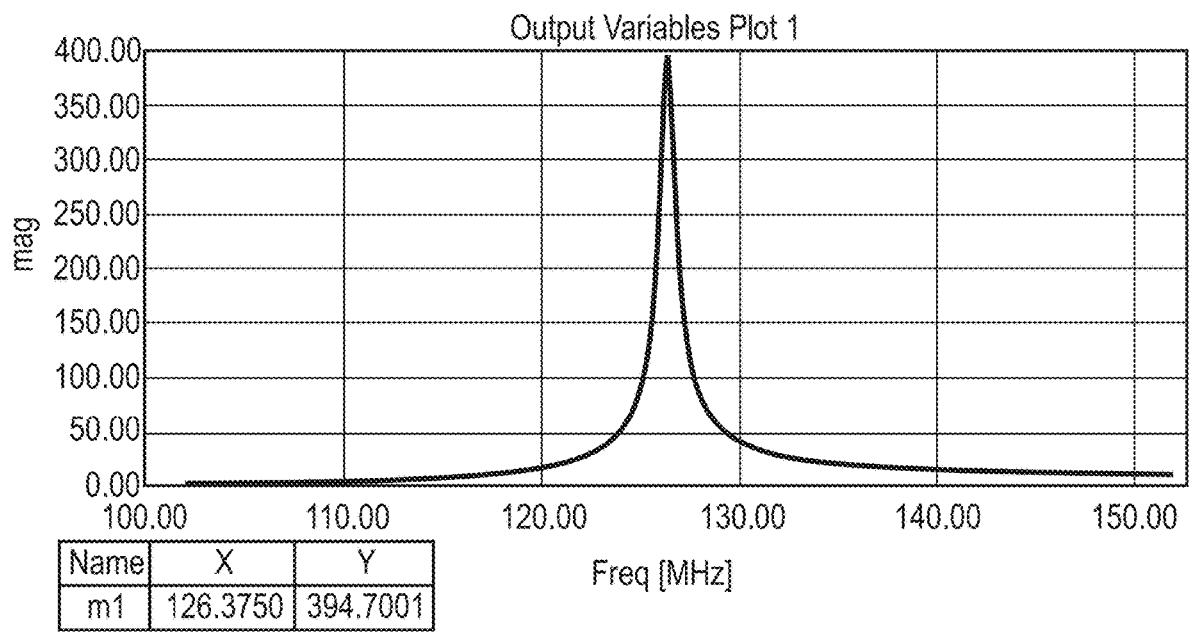
FIG. 14 is a graph illustrating a blocking impedance of a plurality of current cable traps (e.g., 32 current cable traps) disposed about a cable at 3.0 T, in accordance with aspects of the present disclosure.
Figure 15:
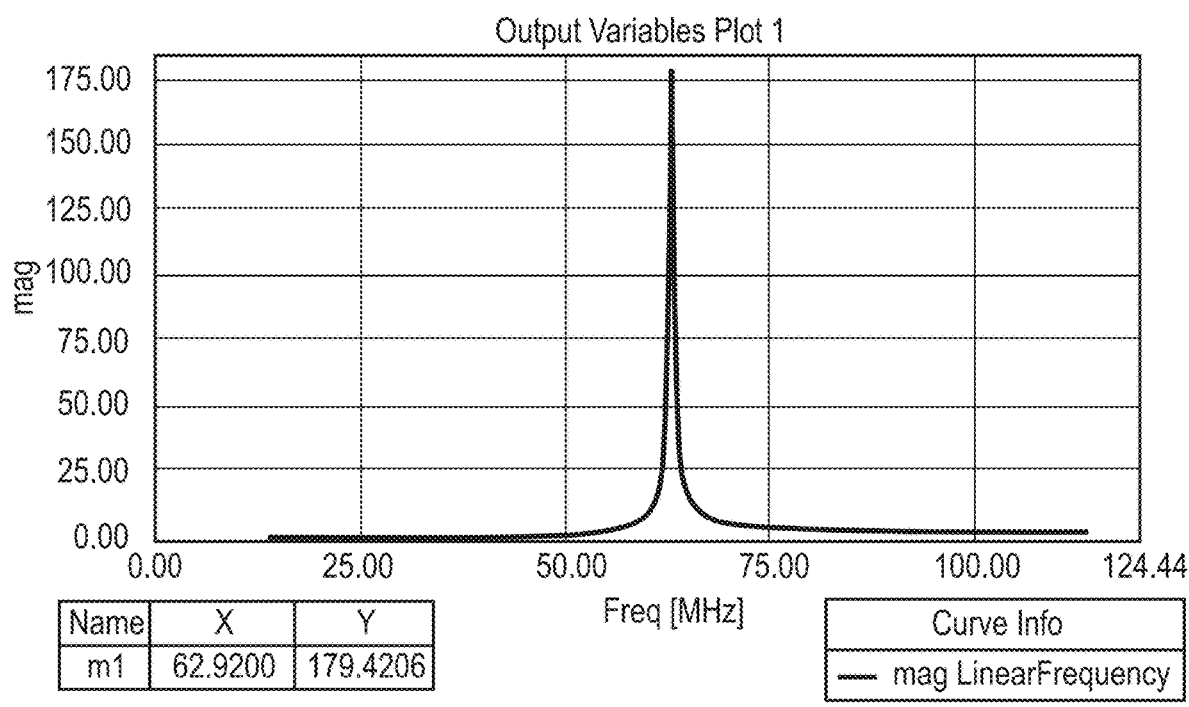
FIG. 15 is a graph illustrating a blocking impedance of a plurality of current cable traps (e.g., 32 current cable traps) disposed about a cable at 1.5 T, in accordance with aspects of the present disclosure.

In general, each toroid (i.e., current cable trap 192) yields approximately 400 ohms impedance at 3.0 Tesla (T) and approximately 180 ohms impedance at 1.5 T. The impedance adds constructively across the cable for a total impedance of 12.8 kiloohms at 3.0 T (as depicted in FIGS. 14) and 5.8 kiloohms at 1.5 T (as depicted in FIG. 15) for a density of 32 toroids or current cable traps 192 disposed on the cable. This distributed impedance provides better blocking than traditional baluns.

Other benefits of the toroid-shaped current cable trap include improved $B_1$ distortion which leads to lesser potential for signal-to-noise ratio degradation due to distortion from the cable and, thus, improved image quality. FIG. 16 depicts tables 266, 268, and 270 comparing $B_1$ distortion at different regions between a standard cable (e.g., having a standard balun) and a cable having a plurality of current cable traps. Table 266 provides the minimal flip angle difference (indicative of $B_1$ distortion) derived from 10 millimeter (mm) coronal slices taken from different regions of interest along the phantom (e.g., middle, bottom, and top) where a standard cable is disposed straight across a phantom. Table 268 provides the minimal flip angle difference derived from 10 mm coronal slices taken from different regions of interest along the phantom (e.g., middle, bottom, and top) where a cable having 30 toroid current cable traps (as described herein) is disposed straight across a phantom. Table 270 provides the minimal flip angle difference derived from 10 mm coronal slices taken from different regions of interest along the phantom (e.g., middle, bottom, and top) where a cable having 30 toroid current cable traps (as described herein) is disposed in a U-shape about a phantom. The shaded values for minimal flip angle difference indicates regions of less distortion. As depicted in the tables 266, 268, 270, the toroid-shaped current cable traps improve Bi distortion.

Among other benefits of the toroid-shaped current cable trap provides greater thermodynamic stability. In particular, a cable with a plurality of toroid-shaped current cable traps takes time to stabilize in temperature than a cable with standard cable baluns. The plurality of toroid-shaped current cable traps distributes heat along the cable while eliminating cable hot spots.

Among other benefits of the toroid-shaped current cable traps are their greater ease of manufacturing. As noted above, the toroid shaped current cable trap has a no-tune configuration. Each toroid-shaped current cable trap uses the same printed circuit boards and components. In addition, each of the toroid-shaped current cable traps can be supplied fully assembled and placed on a cable prior to the overmoulding process (thus, no assembly is done on site). Further, as noted above, placement of the toroid-shaped current cable traps is not critical to function.

Figure 17:
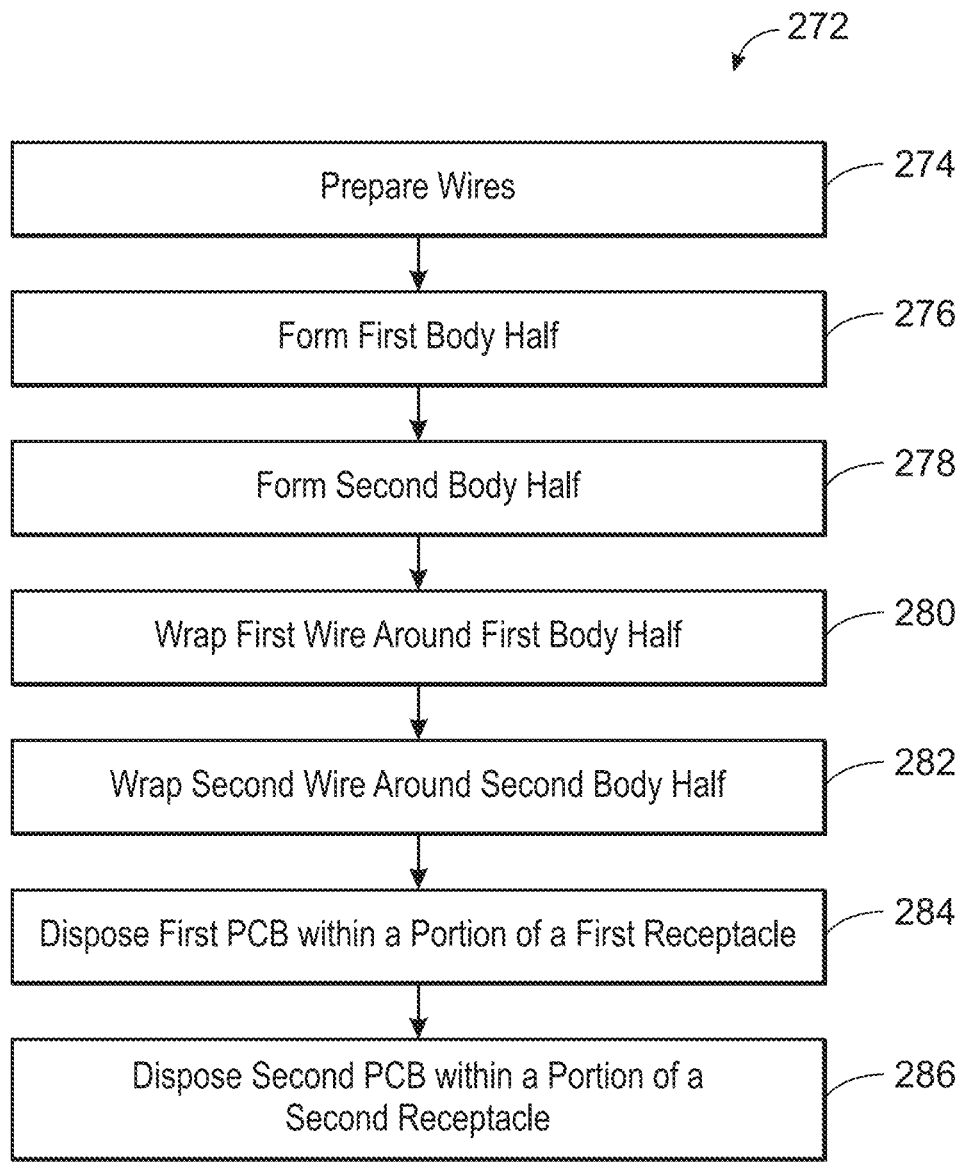
FIG. 17 depicts a method for manufacturing a current cable trap, in accordance with aspects of the present disclosure.

FIG. 17 depicts a flow chart of a method 272 for manufacturing a toroid-shaped current cable trap or balun. One or more of the steps may be performed simultaneously or in a different order from that depicted in FIG. 17.

The method 272 includes preparing wires for the current cable trap (block 274). Depending on the type of wire, the preparation of the wires may vary. In certain embodiments, preparation includes stripping, tinning, flattening, and bending in a U-shape each respective ends of the wires.

The method 272 also includes forming a first body half having a first end and a second end (block 276). The method 272 also includes forming a second body half having a third end and a fourth end (block 278). Each body half includes respective internal and external grooves for receiving wires and grooves on the ends for receiving wire ends and printed circuit boards. The first body half and the second body half are configured to be snapped together about a cable to form a toroid body disposed about the cable. In certain embodiments, the body halves may be additively manufactured or three-dimensionally (3D) printed. For example, the body halves may be 3D printed utilizing powered nylon. In certain embodiments, the body halves may be injection molded. For example, PTFB, a polycarbonate resin thermoplastic, or other material may be utilized as the material.

The method 272 further includes wrapping a first wire around the first body half from the first end to the second end (block 280). The method 272 even further includes wrapping a second wire around the second body half from the third end to the fourth end (block 282). In assembling a respective wire on a respective body half: first, one wire end of the respective wire is secured (e.g., anchored) about a respective wall portion of a respective groove adjacent one end of a respective body half; second, the respective wire is wrapped about the respective body half toward the opposite end within the respective internal and external grooves; and third, the other wire end of the respective wire is secured (e.g., anchored) about the respective wall portion of the opposite groove adjacent the opposite end of the respective body half.

The method 272 still even further includes disposing a first printed circuit board (PCB) within a first portion of a first receptacle located in the first end or the third end (block 284). The first end and the third end form the first receptacle when the first body half and the second body half are snapped together. The method 272 yet further includes disposing a second printed circuit board (PCB) within a second portion of a second receptacle located in the second end or the fourth end (block 286). The second end and the fourth end form the second receptacle when the first body half and the second body half are snapped together. The first printed circuit board and the second printed circuit board each provide electrical connection points with wire ends of both the first wire and the second wire.

Technical effects of the disclosed subject matter include providing a balun or current cable trap having a split toroid configuration. Technical effects of the disclosed subject matter also include providing a current cable trap with a self-contained, no-tune configuration that enables close placement of the current cable traps along a cable without causing detuning or interference among the current cable traps. Technical effects of the disclosed subject matter further include provide current cable traps that do not need additional tuning due to having a same capacitor value and a same number of capacitors for each structure. Technical effects of the disclosed subject matter even further include providing current cable traps that improve patient safety by improving impedance across the cable and, thus, providing better suppression of common-mode currents that could lead to RF burns of the patient. Technical effects of the disclosed subject matter still further include improving image quality due to less Bi distortion. Technical effects of the disclosed subject matter yet further include a reduction in coil temperature (e.g., RF coil temperature) due to improved balun or current cable trap performance (i.e., allowing higher $B_1$+rms or root-mean-square value of the MRI effective component of the RF magnetic ($B_1$) field)). Technical effects of the disclosed subject matter still further include providing improving serviceability since individual current cable traps due to the split configuration can be individually removed and replaced along the cable. Technical effects of the disclosed subject matter further include providing for a lighter cable due to the smaller size and uniformity of the current cable traps. Technical effects of the disclosed subject matter further include reducing manufacturing cost due to easily-sourced and inexpensive material utilized for manufacturing the current cable traps.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112 (f). However, for any claims containing elements designated in any other manner, it is intended that such elements are not to be interpreted under 35 U.S.C. 112 (f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A current cable trap, comprising:
a first body half having a first end and a second end;
a second body half having a third end and a fourth end, wherein the first body half and the second body half are configured to be snapped together about a cable to form a toroid body disposed about the cable;
a first wire wrapped around the first body half from the first end to the second end;
a second wire wrapped around the second body half from the third end to the fourth end;
a first printed circuit board disposed within a first receptacle formed between the first and third ends when the first body half and the second body half are snapped together; and
a second printed circuit board disposed within a second receptacle formed between the second and fourth ends when the first body half and the second body half are snapped together, wherein the first printed circuit board and the second printed circuit board each provide electrical connection points with wire ends of both the first wire and the second wire.

2. The current cable trap of claim 1, wherein the first printed circuit board has a first pair of capacitors and the second printed circuit board has a second pair of capacitors, wherein each capacitor of both the first pair of capacitors and the second pair of capacitors has a same capacitor value.

3. The current cable trap of claim 1, wherein a first wire end of the first wire is configured to fit in a first groove adjacent the first end of the first body half and a second wire end of the first wire is configured to fit in a second groove adjacent the second end of the first body half, and wherein a third wire end of the second wire is configured to fit in a third groove adjacent the third end of the second body half and a fourth wire end of the second wire is configured to fit in a fourth groove adjacent the fourth end of the second body half.

4. The current cable trap of claim 3, wherein the first groove and the third groove form the first receptacle, and wherein the second groove and the fourth groove form the second receptacle.

5. The current cable trap of claim 3, wherein the first wire end and the second wire end each have a U-shape to respectively secure the first wire end and the second wire end within the first groove and the second groove, and wherein the third wire end and the fourth wire end each have the U-shape to respectively secure the third wire end and the fourth wire end within the third groove and the fourth groove.

6. The current cable trap of claim 5, wherein a respective bottom portion of the U- shape of each of the first wire end, the second wire end, the third wire end, and the fourth wire end is configured to interface with a respective electrical connection point of the electrical connection points.

7. The current cable trap of claim 1, wherein the first body half comprises a first set of internal and external grooves disposed between the first end and the second end that the first wire is disposed within when wrapped around the first body half, and wherein the second body half comprises a second set of internal and external grooves disposed between the third end and the fourth end that the second wire is disposed within when wrapped around the second body half.

8. The current cable trap of claim 1, wherein the current cable trap is configured to be removed from the cable without needing to remove other current cable traps disposed along the cable.

9. The current cable trap of claim 1, wherein the current cable trap is configured when the cable is generating a current to generate a self-contained magnetic field that does not cause detuning or interference with adjacent current cable traps disposed along the cable.

10. The current cable trap of claim 1, wherein the cable couples a radio frequency receiving coil assembly to a connector that is configured to couple the radio frequency receiving coil assembly to a magnetic resonance imaging system.

11. The current cable trap of claim 1, wherein the cable is disposed within an enclosure of a radio frequency receiving coil assembly having a radio frequency coil configured for use with a magnetic resonance imaging system.

12. A cable for a radio frequency receiving coil assembly configured for use with a magnetic resonance imaging system, comprising:
a plurality of current cable traps disposed about the cable, wherein each current cable trap of the plurality of current cable traps is configured when the cable is generating a current to generate a self-contained magnetic field that does not cause detuning or interference with adjacent current cable traps disposed along the cable, and wherein each current cable trap of the plurality of current cable traps is configured to be removed from the cable without needing to remove other current cable traps of the plurality of current cable traps disposed along the cable; and
wherein each current cable trap of the plurality of current cable traps, comprises:
a first body half having a first end and a second end;
a second body half having a third end and a fourth end, wherein the first body half and the second body half are configured to be snapped together about a cable to form a toroid body disposed about the cable;
a first wire wrapped around the first body half from the first end to the second end;
a second wire wrapped around the second body half from the third end to the fourth end;
a first printed circuit board disposed within a first receptacle formed between the first and third ends when the first body half and the second body half are snapped together; and
a second printed circuit board disposed within a second receptacle formed between the second and fourth ends when the first body half and the second body half are snapped together, wherein the first printed circuit board and the second printed circuit board each provide electrical connection points with wire ends of both the first wire and the second wire.

13. The cable of claim 12, wherein the first printed circuit board has a first pair of capacitors and the second printed circuit board has a second pair of capacitors, wherein each capacitor of both the first pair of capacitors and the second pair of capacitors has a same capacitor value.

14. The cable of claim 12, wherein a first wire end of the first wire is configured to fit in a first groove adjacent the first end of the first body half and a second wire end of the first wire is configured to fit in a second groove adjacent the second end of the first body half, and wherein a third wire end of the second wire is configured to fit in a third groove adjacent the third end of the second body half and a fourth wire end of the second wire is configured to fit in a fourth groove adjacent the fourth end of the second body half.

15. The cable of claim 14, wherein the first groove and the third groove form the first receptacle, and wherein the second groove and the fourth groove form the second receptacle.

16. The cable of claim 14, wherein the first wire end and the second wire end each have a U-shape to respectively secure the first wire end and the second wire end within the first groove and the second groove, and wherein the third wire end and the fourth wire end each have the U-shape to respectively secure the third wire end and the fourth wire end within the third groove and the fourth groove.

17. The cable of claim 16, wherein a respective bottom portion of the U-shape of each of the first wire end, the second wire end, the third wire end, and the fourth wire end is configured to interface with a respective electrical connection point of the electrical connection points.

18. The cable of claim 12, wherein the first body half comprises a first set of internal and external grooves disposed between the first end and the second end that the first wire is disposed within when wrapped around the first body half, and wherein the second body half comprises a second set of internal and external grooves disposed between the third end and the fourth end that the second wire is disposed within when wrapped around the second body half.

19. A method for manufacturing a current cable trap, comprising:
forming a first body half having a first end and a second end;
forming a second body half having a third end and a fourth end, wherein the first body half and the second body half are configured to be snapped together about a cable to form a toroid body disposed about the cable;
wrapping a first wire around the first body half from the first end to the second end;
wrapping a second wire around the second body half from the third end to the fourth end;

disposing a first printed circuit board within a first portion of a first receptacle located in the first end or the third end, wherein the first end and the third end form the first receptacle when the first body half and the second body half are snapped together; and disposing a second printed circuit board within a second portion of a second receptacle located in the second end or the fourth end, wherein the second end and the fourth end form the second receptacle when the first body half and the second body half are snapped together, and wherein the first printed circuit board and the second printed circuit board each provide electrical connection points with wire ends of both the first wire and the second wire.

\* \* \* \* \*